(12) United States Patent
Richter et al.

(10) Patent No.: US 8,129,276 B2
(45) Date of Patent: Mar. 6, 2012

(54) VOID SEALING IN A DIELECTRIC MATERIAL OF A CONTACT LEVEL OF A SEMICONDUCTOR DEVICE COMPRISING CLOSELY SPACED TRANSISTORS

(75) Inventors: Ralf Richter, Dresden (DE); Kai Frohberg, Niederau (DE); Holger Schuehrer, Dresden (DE)

(73) Assignee: Globalfoundries Inc., Grand Cayman (KY)

( * ) Notice: Subject to any disclaimer, the term of this patent is extended or adjusted under 35 U.S.C. 154(b) by 47 days.

(21) Appl. No.: 12/693,545

(22) Filed: Jan. 26, 2010

(65) Prior Publication Data

US 2010/0193963 A1    Aug. 5, 2010

(30) Foreign Application Priority Data

Jan. 30, 2009    (DE) .......................... 10 2009 006 881

(51) Int. Cl.
*H01L 23/48* (2006.01)
*H01L 21/768* (2006.01)

(52) U.S. Cl. . 438/675; 438/624; 438/637; 257/E23.011; 257/E21.586

(58) Field of Classification Search .................. 438/624, 438/637, 675
See application file for complete search history.

(56) References Cited

U.S. PATENT DOCUMENTS

| | | | |
|---|---|---|---|
| 7,442,598 B2 | 10/2008 | Grudowski et al. | 438/199 |
| 2002/0001936 A1 | 1/2002 | Terauchi et al. | 438/618 |
| 2002/0036349 A1 | 3/2002 | Saito et al. | 257/758 |
| 2005/0035460 A1 | 2/2005 | Tseng | 257/760 |
| 2005/0136649 A1 | 6/2005 | Lee et al. | 438/637 |

FOREIGN PATENT DOCUMENTS

| | | |
|---|---|---|
| DE | 102 17 386 A1 | 11/2003 |
| WO | WO 97/06556 | 2/1997 |

OTHER PUBLICATIONS

Translation of Official Communication from German Patent Office for German Patent Application No. 10 2009 006 881.3-33 dated Aug. 25, 2009.
Translation of Official Communication from German Patent Office for German Patent Application No. 10 2009 006 881.3-33 dated Aug. 4, 2010.

*Primary Examiner* — Alexander Ghyka
(74) *Attorney, Agent, or Firm* — Williams, Morgan & Amerson, P.C.

(57) ABSTRACT

In sophisticated semiconductor devices, a contact structure may be formed on the basis of a void positioned between closely spaced transistor elements wherein disadvantageous metal migration along the void may be suppressed by sealing the voids after etching a contact opening and prior to filling in the contact metal. Consequently, significant yield losses may be avoided in well-established dual stress liner approaches while, at the same time, superior device performance may be achieved.

11 Claims, 7 Drawing Sheets

VOID SEALING IN A DIELECTRIC MATERIAL OF A CONTACT LEVEL OF A SEMICONDUCTOR DEVICE COMPRISING CLOSELY SPACED TRANSISTORS

BACKGROUND OF THE INVENTION

1. Field of the Invention

Generally, the present disclosure relates to the field of integrated circuits, and, more particularly, to field effect transistors and manufacturing techniques on the basis of stressed dielectric layers formed above the transistors and used for generating a different type of strain in channel regions of different transistor types.

2. Description of the Related Art

Integrated circuits are typically comprised of a large number of circuit elements located on a given chip area according to a specified circuit layout, wherein, in complex circuits, the field effect transistor represents one predominant circuit element. Generally, a plurality of process technologies for advanced semiconductor devices are currently practiced, wherein, for complex circuitry based on field effect transistors, such as microprocessors, storage chips and the like, CMOS technology is currently one of the most promising approaches due to the superior characteristics in view of operating speed and/or power consumption and/or cost efficiency. During the fabrication of complex integrated circuits using CMOS technology, millions of complementary transistors, i.e., N-channel transistors and P-channel transistors, are formed on a substrate including a crystalline semiconductor layer. A field effect transistor, irrespective of whether an N-channel transistor or a P-channel transistor is considered, comprises so-called PN junctions that are formed by an interface of highly doped drain and source regions with an inversely or weakly doped channel region disposed between the drain region and the source region. The conductivity of the channel region, i.e., the drive current capability of the conductive channel, is controlled by a gate electrode formed above the channel region and separated therefrom by a thin insulating layer. The conductivity of the channel region, upon formation of a conductive channel due to the application of an appropriate control voltage to the gate electrode, depends on the dopant concentration, the mobility of the majority charge carriers and, for a given extension of the channel region in the transistor width direction, on the distance between the source and drain regions, which is also referred to as channel length. Hence, in combination with the capability of rapidly creating a conductive channel below the insulating layer upon application of the control voltage to the gate electrode, the conductivity of the channel region substantially determines the performance of the MOS transistors. Thus, the reduction of the channel length, and associated therewith the reduction of the channel resistivity, may be a dominant design criterion for accomplishing an increase in the operating speed of the integrated circuits.

The shrinkage of the transistor dimensions, however, involves a plurality of issues associated therewith that have to be addressed so as to not unduly offset the advantages obtained by steadily decreasing the channel length of MOS transistors. One issue associated with reduced gate lengths is the occurrence of so-called short channel effects, which may result in a reduced controllability of the channel conductivity. Short channel effects may be countered by certain design techniques, some of which, however, may be accompanied by a reduction of the channel conductivity, thereby partially offsetting the advantages obtained by the reduction of critical dimensions.

In view of this situation, it has been proposed to enhance device performance of the transistor elements not only by reducing the transistor dimensions but also by increasing the charge carrier mobility in the channel region for a given channel length, thereby increasing the drive current capability and thus transistor performance. For example, the lattice structure in the channel region may be modified, for instance, by creating tensile or compressive strain therein, which results in a modified mobility for electrons and holes, respectively. For example, creating tensile strain in the channel region of a silicon layer having a standard crystallographic configuration may increase the mobility of electrons, which in turn may directly translate into a corresponding increase of the conductivity of N-type transistors. On the other hand, compressive strain in the channel region may increase the mobility of holes, thereby providing the potential for enhancing the performance of P-type transistors.

One efficient approach in this respect is a technique that enables the creation of desired stress conditions within the channel region of different transistor elements by adjusting the stress characteristics of a dielectric layer stack that is formed above the basic transistor structure. The dielectric layer stack typically comprises one or more dielectric layers which may be located close to the transistor and which may also be used in controlling a respective etch process in order to form contact openings to the gate and drain and source terminals. Therefore, an effective control of mechanical stress in the channel regions, i.e., effective stress engineering, may be accomplished by individually adjusting the internal stress of these layers, which may also be referred to as contact etch stop layers, and by positioning a contact etch stop layer having an internal compressive stress above a P-channel transistor while positioning a contact etch stop layer having an internal tensile strain above an N-channel transistor, thereby creating compressive and tensile strain, respectively, in the respective channel regions.

Typically, the contact etch stop layer is formed by plasma enhanced chemical vapor deposition (PECVD) processes above the transistor, i.e., above the gate structure and the drain and source regions, wherein, for instance, silicon nitride may be used due to its high etch selectivity with respect to silicon dioxide, which is a well-established interlayer dielectric material. Furthermore, PECVD silicon nitride may be deposited with a high intrinsic stress, for example, up to 2 Giga-Pascal (GPa) or significantly higher of compressive stress and up to 1 GPa and significantly higher of tensile stress, wherein the type and the magnitude of the intrinsic stress may be efficiently adjusted by selecting appropriate deposition parameters. For example, ion bombardment, deposition pressure, substrate temperature, gas flow rates and the like represent respective parameters that may be used for obtaining the desired intrinsic stress.

During the formation of the two types of stressed layers, conventional techniques may suffer from reduced efficiency when device dimensions are increasingly scaled by using the 45 nm technology and even further advanced approaches, due to the limited conformal deposition capabilities of the deposition processes involved, which may result in respective process non-uniformities during subsequent process steps for patterning the stressed layer and forming contact openings, as will be explained in more detail with reference to FIGS. 1a-1e.

FIG. 1a schematically illustrates a cross-sectional view of a semiconductor device 100 in a certain manufacturing stage for forming stress-inducing layers above a first device area 120A and a second device area 120B. The first and second device areas 120A, 120B, which typically represent respective transistor elements, may be formed above a substrate 101 comprising a semiconductor layer 102, such as a silicon-based layer, which may be separated from the substrate 101 by an appropriate buried insulating layer if a silicon-on-insulator (SOI) configuration is considered. In the example shown, the first and second device areas 120A, 120B may comprise a plurality of transistor elements with a lateral distance according to the design rules of the technology under consideration. The transistors in the first and second device areas 120A, 120B may comprise a gate electrode 121 formed on a respective gate insulation layer 123, which separates the gate electrode 121 from a corresponding channel region 124, which is laterally located between respective drain/source regions 125. Furthermore, a sidewall spacer structure 122 may be formed on sidewalls of the gate electrode 121. Typically, metal silicide regions (not shown) may be provided in the drain and source regions 125 and the gate electrodes 121 in order to enhance the conductivity of these areas. The semiconductor device 100 may represent an advanced device, in which critical dimensions, such as the gate length, i.e., in FIG. 1*a*, the horizontal extension of the gate electrodes 121, may be approximately 50 nm or less. Consequently, a distance between respective transistor elements, i.e., the lateral distance between neighboring sidewall spacer structures 122 of closely spaced transistor elements, as shown in the device region 120B, may be approximately 100 nm or even less.

It should be appreciated that the first and second device regions 120A, 120B may be separated by an appropriate isolation structure (not shown) if required. Furthermore, in the manufacturing stage shown in FIG. 1*a*, a silicon nitride layer 130, comprising, for instance, a high intrinsic tensile stress, is formed above the first and second device areas 120A, 120B followed by an etch indicator layer 131 comprised of silicon dioxide. It should be appreciated that, if required, an etch stop layer, such as a silicon dioxide layer of appropriate thickness and density, may be provided between the silicon nitride layer 130 and the respective transistor elements in the first and second device areas 120A, 120B. The etch indicator layer 131 is typically provided with a thickness that is sufficient to stop an etch process in a later stage when patterning the layer 130, or to provide a pronounced endpoint detection signal. That is, a silicon nitride etch chemistry reacting with silicon dioxide results in a specific plasma ambient, which can be detected by standard detection techniques. Usually, a thickness of the etch indicator layer 131 is selected such that sufficient etch control across the substrate is achieved. In some approaches, the etch indicator layer 131 may act as a hard mask during the patterning of the silicon nitride layer 130.

As is evident from FIG. 1*a*, due to the reduced spacing between neighboring transistor elements, the silicon nitride layer 130 may have to be deposited with a moderately low thickness to take into consideration the gap fill capabilities of the deposition process, since when the spacing between the transistor elements may be on the order of two times a layer thickness of the silicon nitride layer 130, the limited conformal fill behavior may result in corresponding defects, such as voids.

Furthermore, in this manufacturing stage, the semiconductor device 100 may comprise a resist mask 103 exposing the first device area 120A while covering the second device region 120B. In this case, it may be assumed that the intrinsic stress of the silicon nitride layer 130 may be appropriately selected to enhance the transistor performance in the second device area 120B.

A typical process flow for forming the semiconductor device 100 as shown in FIG. 1*a* may comprise the following processes. The gate electrodes 121 and the gate insulation layers 123 may be formed and patterned on the basis of well-established process techniques including advanced photolithography, deposition, oxidation and etch techniques. Thereafter, the drain and source regions 125 may be formed in combination with the sidewall spacer structures 122 on the basis of well-established deposition, anisotropic etch processes and implantation sequences in order to establish the desired vertical and lateral dopant profile. Thereafter, respective silicide regions may be formed, if required, on the basis of well-established techniques. Next, if required, a corresponding silicon dioxide etch stop layer may be formed followed by the deposition of the silicon nitride layer 130. During the deposition of the silicon nitride material, respective process parameters, such as composition of carrier gases and reactive gases, substrate temperature, deposition pressure and in particular ion bombardment during the deposition, may significantly influence the finally obtained intrinsic stress of the material as deposited with respect to the underlying materials. Thus, by selecting appropriate parameter values, a high degree of intrinsic stress, such as up to 2 GigaPascal (GPa) and even more of compressive stress or up to 1 GPa or even significantly higher of tensile stress, may be created to enhance the performance of the transistor in the second device area 120B. Due to the less pronounced conformality of the silicon nitride deposition process above a certain layer thickness and for increased aspect ratios, as may occur in highly scaled devices caused by the reduced distance between the neighboring transistor elements 120B at moderately dimensioned gate heights in densely packed device areas, as shown, the thickness of the silicon nitride material is selected to avoid irregularities, such as voids. Thus, the deposition process for the silicon dioxide layer 131 may encounter an even more pronounced surface topography, thereby also requiring enhanced gap fill capabilities while avoiding increased oxide thickness and the creation of a void.

After the deposition of the silicon dioxide layer 131, the resist mask 103 may be formed on the basis of well-established photolithography techniques. Next, an appropriately designed etch process may be performed in order to remove a portion of the layers 130 and 131 from the device area 120A. During the corresponding etch process, the silicon dioxide material of the layer 131 may be removed first followed by a selective etch process for removing the material of the silicon nitride layer 130, wherein the corresponding etch process may be controlled on the basis of an etch stop layer, if required.

FIG. 1*b* schematically illustrates the semiconductor device 100 at a further advanced manufacturing stage. As shown, a second dielectric layer 140 may be formed above the first and second device areas 120A, 120B, wherein a void 132 may be present in the second device area 120B due to the limited gap filling capability of the deposition process for forming a highly stressed silicon nitride material and the pronounced surface topography previously created during the deposition of the layers 130, 131. Although the void 132 may be advantageous in view of reducing the parasitic capacitance between the closely spaced transistors in the region 120B, the probability of increasing significant yield losses is increased during the further processing due to an increase of leakage currents, as will be explained later on.

Furthermore, at the manufacturing stage shown in FIG. 1*b*, a corresponding resist mask 104 is provided to protect the dielectric layer 140 during a corresponding etch process 105 for removing the exposed portion of the layer 140 in the second device region 120B.

With respect to the formation of the second dielectric layer 140, substantially the same criteria apply as previously explained with respect to the layer 130. Hence, during the deposition of the layer 140, respective process parameters may be adjusted in an appropriate manner so that a desired high intrinsic stress may be obtained. In sophisticated applications, i.e., in semiconductor devices of feature sizes of approximately 50 nm and less, the gap fill capabilities of the deposition process for forming the layer 140 may also play an important role for the etch process 105, since, in combination with the surface topography generated during the deposition of the layers 130 and 131, a substantially complete removal of the exposed portion of the layer 140 may depend on the deposition capabilities of the subsequent deposition for a given device geometry. Due to the creation of the void 132, the thickness of the layer 140 may be increased in the vicinity of the void, which may result in a non-sufficient removal of the material of the layer 140 during the process 105. Thus, the void 132 may be maintained after the process 105, thereby further contributing to increased yield loss during the further processing due to contact failures.

FIG. 1c schematically illustrates the device 100 at a further advanced manufacturing stage, wherein a corresponding interlayer dielectric material 150, for instance comprised of silicon dioxide, may be formed above the first and second dielectric layers 130, 140. The dielectric material 150 may be formed on the basis of well-established techniques, such as sub-atmospheric deposition processes on the basis of TEOS, plasma assisted chemical vapor deposition (CVD) and the like, which may be followed by respective planarization processes, if required. Thereafter, respective contact openings 151 may be formed, which may, in some cases, for instance in dense RAM regions, connect to the device layer at areas located between respective closely spaced transistors. During the deposition of the material 150, the pronounced topography may also result in the creation of voids between the closely spaced transistors 120B, wherein the previously formed void 132 may contribute to respective deposition irregularities. Thus, the corresponding void 132 may be present in the material and may also affect the subsequent fabrication process, since the void 132 may be partially filled with a contact metal to be filled in the contact openings, thereby resulting in increased leakage or even total contact failures.

FIG. 1d schematically illustrates a top view of a portion of the semiconductor device 100 wherein it may be assumed that the interlayer dielectric material 150 may be transparent so that the corresponding gate electrodes 121 or transistors in the device region 120 are visible. Moreover, contact openings 151A, 151B may be formed in the interlayer dielectric material 150 and may extend to corresponding contact regions (not shown) of the semiconductor material of the device region 120. Furthermore, the void 132 indicated by the dashed lines may extend between the adjacent gate electrodes 121 along a width direction, as indicated by W. Thus, the void 132 may extend between the contact openings 151A, 151B and may thus result in increased leakage currents upon filling the contact openings 151A, 151B with a metal-containing material due to metal migration along the void 132.

FIG. 1e schematically illustrates a cross-sectional view of the semiconductor device 100 along the section Ie of FIG. 1d. As illustrated, contact elements 152 may be formed on the basis of the contact openings 151A, 151B wherein any appropriate metal, such as tungsten, copper, aluminum and the like, possibly in combination with an appropriate barrier material, may be filled into the openings 151A, 151B in accordance with well-established process techniques. During the deposition of the corresponding metal-containing material, which may frequently be performed on the basis of deposition techniques, such as CVD and the like, metal may also be deposited and may migrate within the void 132, thereby establishing a conductive path from the contact elements 152 into the interlayer dielectric material, which may thus result in increased leakage currents and reduced dielectric breakdown strength of the interlayer dielectric material 150. Furthermore, for highly scaled devices, the diffusion or migration of the metal material 152 along the void 132 may even result in a short circuit between the adjacent contact elements 152, thereby contributing to significant yield loss, since a corresponding contact failure may result in a total loss of the entire device 100.

As a consequence, upon further device scaling, the limitations of deposition and patterning regimes for dielectric materials of high internal stress levels may require a significant reduction of the layer thickness of the stress-inducing material layers, for instance the layer 130, in order to comply with the pronounced surface topography encountered in advanced device geometries. However, in this case, the resulting strain induced by the stressed dielectric materials may also be significantly reduced, thereby compromising overall transistor performance. Hence, in many conventional strategies, great efforts are being made in an attempt to reduce the probability of creating voids during the deposition of the interlayer dielectric material, thereby contributing to the overall process complexity and/or reducing the finally achieved transistor performance. On the other hand, maintaining the voids between closely spaced transistor elements, which may be advantageous in view of reducing the parasitic capacitance and also in view of enabling the deposition of an increased amount of stress-inducing material, it may be less than desirable on the basis of conventional process strategies due to the high risk of creating contact failures.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the subject matter disclosed herein addresses the problem of increased yield losses in extremely scaled transistor elements which are caused by non-uniformities during the patterning of contact openings and the subsequent filling thereof with a metal-containing material. For this purpose, the deposition of an interlayer dielectric material, which may, in some illustrative embodiments, comprise a stress-inducing material, may be performed on the basis of less restrictive constraints with respect to the avoidance of any voids or other irregularities, thereby providing the possibility of, for instance, depositing an increased amount of strain-inducing material and thus extending well-established strain-inducing mechanisms, such as dual stress liner approaches and the like, to further scaled device generations. The probability of creating conductive paths as the basis of the void, which may be advantageous in terms of reducing the overall parasitic capacitance, may be significantly reduced by "sealing" or disconnecting voids from the corresponding contact openings prior to filling them with an appropriate metal-containing material. That is, liner material may be provided, at least at an area in which a void is connected to the contact opening, to suppress metal diffusion or migration after filling in the contact metal. Consequently, by forming this metal confinement liner, a reliable "electrical disconnection" or decoupling of contact elements from the remaining portion of the void may be accomplished, thereby also reducing respective leakage currents and short circuits, which may typically be generated in conventional process techniques, as previously described. The metal confinement liner material may be formed at any appropriate stage after forming at least a portion of the contact opening that connects to the void, wherein, due to the specific geometry, by a transition area between the contact opening and the void and in combination with an appropriately selected deposition recipe, a reliable sealing or closure of the void may be accomplished, which may be maintained throughout the further patterning of the contact opening on the basis of an anisotropic etch process. In other illustrative embodiments, the liner material may be formed after substantially completely forming the contact opening so that in a final etch step any liner material at the bottom of the contact opening may be removed without compromising integrity of the liner material, at least at the interface between the contact opening and the void.

Consequently, by providing the metal confinement liner material prior to filling in the contact metal, a high degree of flexibility in forming and patterning the interlayer dielectric material may be accomplished, since significantly relaxed strains with respect to the deposition and patterning of interlayer dielectric material may be applied, while at the same time the advantages of superior overall permittivity of the contact level in combination with an enhanced strain efficiency may be achieved. Many of the well-established strain-inducing mechanisms, such as a provision of stress-inducing materials of different internal stress levels, may be efficiently applied to extremely scaled semiconductor devices including transistor elements having critical dimensions of 45 nm and less, such as 30 nm and less, without contributing to undue yield losses caused by contact failures.

One illustrative method disclosed herein comprises forming a contact opening in an interlayer dielectric material of a semiconductor device wherein the contact opening extends to a contact region of a semiconductor region and wherein the interlayer dielectric material comprises a stressed dielectric material for inducing a strain in the semiconductor region. The method further comprises forming a dielectric liner material at least partially on inner sidewalls of the contact opening. Finally, the method comprises filling the contact opening with a metal-containing material.

A further illustrative method disclosed herein comprises forming an interlayer dielectric material between and above a plurality of transistors formed in and above a semiconductor region, wherein the interlayer dielectric material comprises a void extending along a transistor width direction between two adjacent ones of the plurality of transistors. The method further comprises forming a contact opening in the interlayer dielectric material between the adjacent two transistors so as to connect to the void. Moreover, a metal confinement liner material is formed on at least a portion of inner sidewalls of the contact opening to suppress metal migration from the contact opening into the void. Finally, the method comprises filling the contact opening, which includes the metal confinement liner material, with a metal-containing material.

One illustrative semiconductor device disclosed herein comprises a plurality of transistors formed in and above a semiconductor region. Moreover, an interlayer dielectric material is formed between and above the plurality of transistors and comprises a void positioned between two adjacent transistors of the plurality of transistors. Additionally, the semiconductor device comprises a contact element embedded in the interlayer dielectric material and extending to a contact region of the semiconductor region, wherein the contact element extends through the void. Finally, the semiconductor device comprises a metal confinement liner material formed on sidewalls of the contact element so as to electrically disconnect the contact element from the void.

BRIEF DESCRIPTION OF THE DRAWINGS

The disclosure may be understood by reference to the following description taken in conjunction with the accompanying drawings, in which like reference numerals identify like elements, and in which:

FIG. 2b schematically illustrates a top view of the device of FIG. 2a;

Figure 1A:
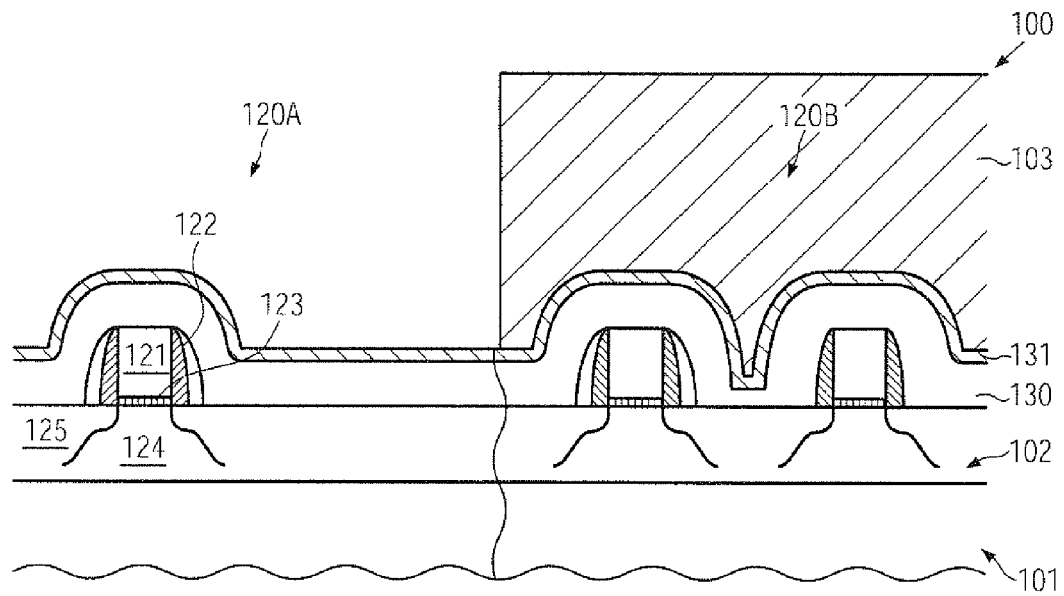
FIGS. 1a-1c schematically illustrate cross-sectional views of a semiconductor device during various manufacturing stages in forming differently stressed dielectric layers according to a conventional dual stress liner approach.
Figure 1B:
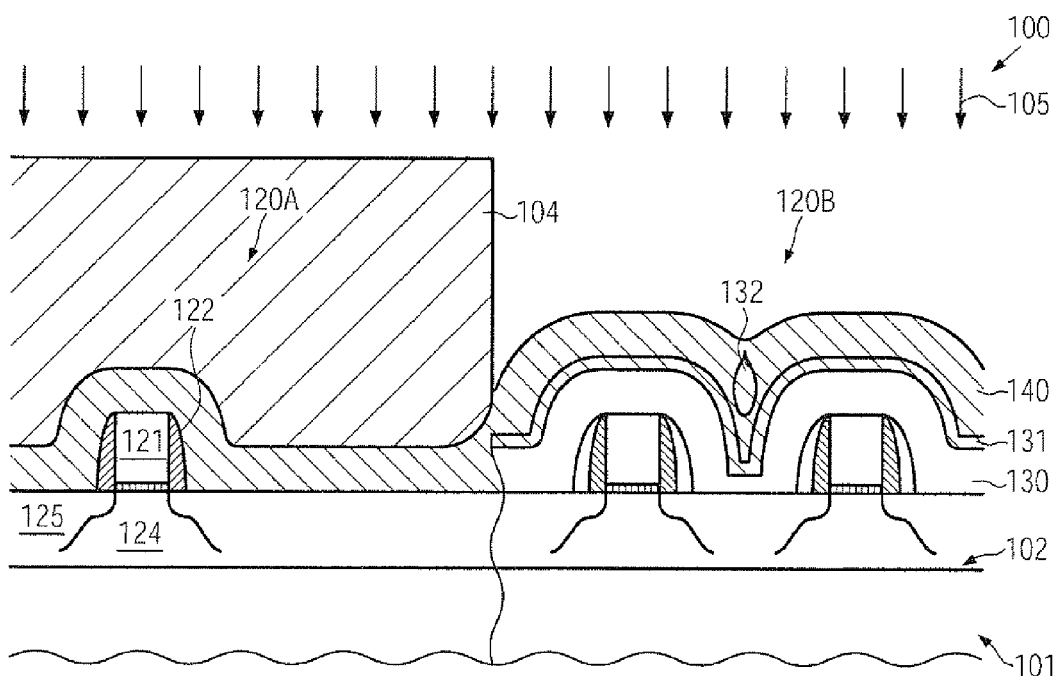
Figure 1C:
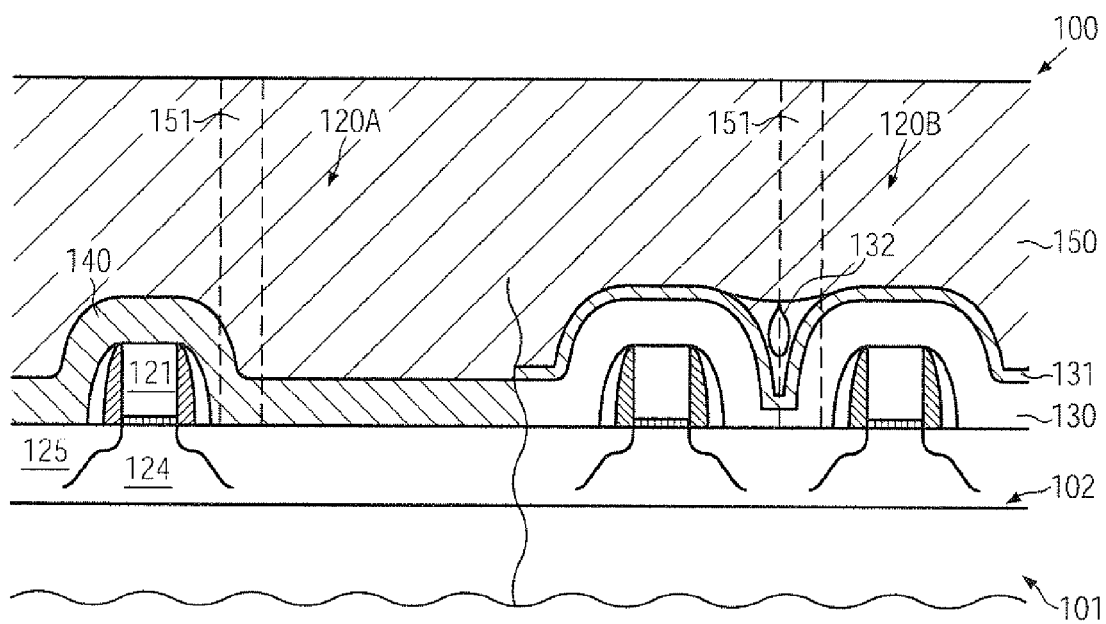
Figure 1D:
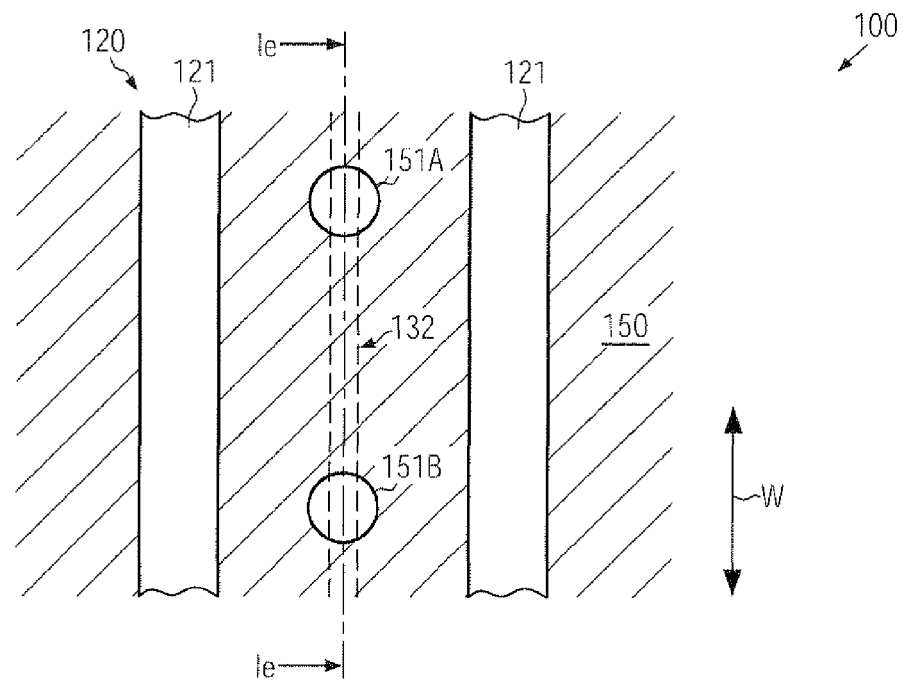
FIG. 1d schematically illustrates a top view of a portion of the semiconductor device after forming corresponding contact openings according to conventional strategies.
Figure 1E:
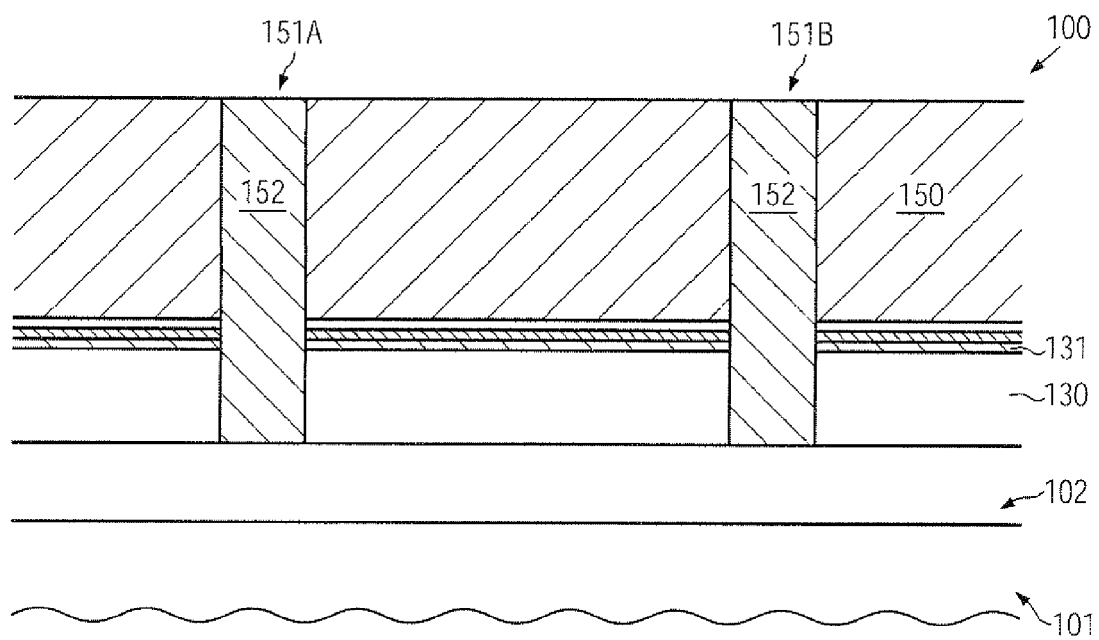
FIG. 1e schematically illustrates a cross-sectional view along line Ie of FIG. 1d wherein increased leakage currents and even total contact failures may be caused upon filling the contact openings with a metal according to conventional approaches.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure provides techniques and semiconductor devices in which the probability of creating contact failures may be reduced, even for sophisticated device geometries encountered during the deposition of interlayer dielectric materials, which may, in some illustrative embodiments, include one or more highly stressed dielectric materials. For this purpose, the interlayer dielectric material may be deposited on the basis of less restrictive constraints, which may, in some conventional approaches, require deposition/etch/deposition cycles for forming a highly stressed dielectric material in that a void may intentionally be formed which may then be sealed or disconnected from critical contact openings by providing an appropriate liner material therein. For this purpose, in some illustrative embodiments, at any appropriate stage after forming the contact opening so as to extend at least to the void, which may have been generated between closely spaced transistor elements as previously explained, a deposition process may be performed to provide a liner material that may efficiently seal the void and may thus "disconnect" the contact opening from the remaining portion of the void. Consequently, during the further processing, for instance during a further etch step and the subsequent filling in of the contact metal, integrity of the sealed void may be maintained, thereby also suppressing metal migration which may conventionally result in significant yield losses. The deposition of the liner material, which may also be referred to as metal confinement liner, may be accomplished on the basis of appropriate deposition techniques, such as thermally activated CVD, in order to form an appropriate thin material layer, such as silicon dioxide, which may be deposited on the basis of deposition techniques exhibiting a superior gap filling behavior. For example, sub-atmospheric deposition of silicon dioxide on the basis of TEOS (tetra ethyl ortho silicate) may provide superior gap filling capabilities and corresponding recipes may be used for forming an appropriate silicon dioxide film on exposed inner sidewalls of the contact opening. It should be appreciated that other materials may also be used as long as the material characteristics, for instance in view of etch behavior and the like, may be compatible with the further processing of the device. For example, a plurality of dielectric materials are available which may be deposited in a highly conformal manner and which may result in an efficient confinement of the contact metal, such as silicon nitride, silicon carbide, nitrogen-containing silicon carbide and the like. In other cases, a conductive material may be used as long as an appropriate deposition behavior may be obtained. For instance, silicon material may be used as a liner material or even specific metal-containing materials may be used, as long as the metal component contained therein may have a reduced tendency for migrating and may also provide metal confinement of the actual contact material.

With reference to FIGS. 2a-2h, further illustrative embodiments will now be described in more detail, wherein reference may also be made to FIGS. 1a-1e, if required.

Figure 2A:
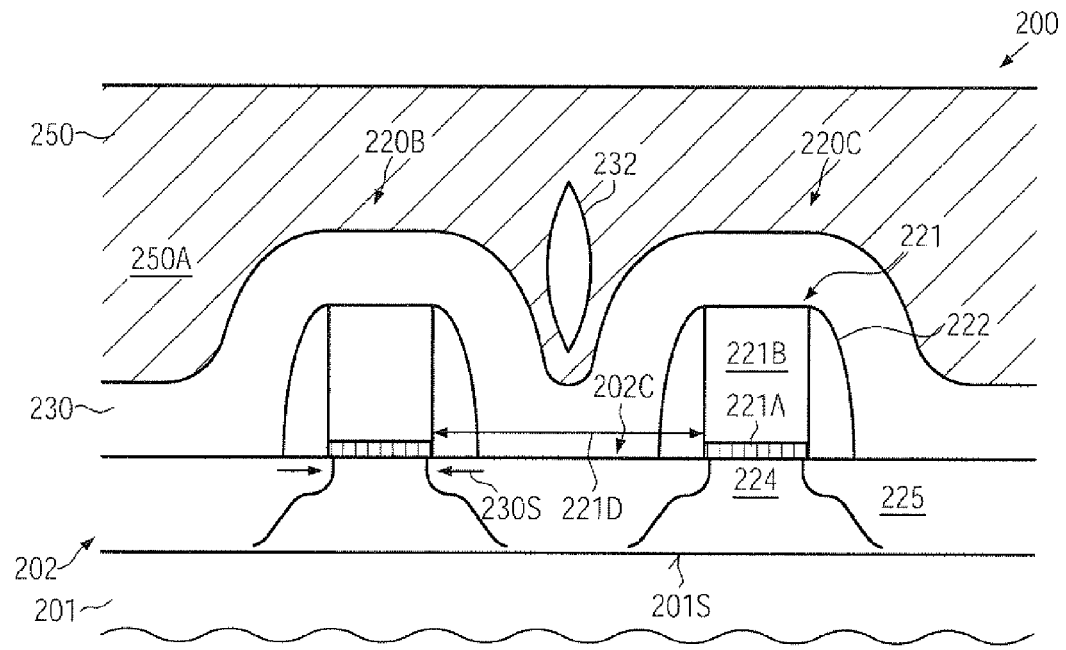
FIG. 2a schematically illustrates a cross-sectional view of a semiconductor device including closely spaced transistor elements and an interlayer dielectric material which may comprise a void extending between the closely spaced transistors according to illustrative embodiments.

FIG. 2a schematically illustrates a cross-sectional view of a semiconductor device 200 in an advanced manufacturing stage. The semiconductor device 200 may comprise a substrate 201 and a semiconductor layer or region 202, which may represent any appropriate semiconductor material for forming therein or thereabove semiconductor elements, such as transistors and the like. For instance, the semiconductor region 202 may comprise crystalline silicon, possibly in combination with other components, such as carbon, germanium and the like, in order to adjust the overall electronic characteristics of the semiconductor region 202. In the embodiment shown, a plurality of transistors 220B, 220C may be formed in and above the semiconductor region 202 and may have any appropriate configuration with respect to conductivity type, overall transistor dimensions and the like. For example, in the embodiment shown, a "planar" transistor configuration may be provided in which a gate electrode structure 221 may be formed above the semiconductor region 202, wherein the gate electrode structure 221 may comprise a gate insulation layer 221A, which separates an electrode material 221B from a channel region 224 provided in the semiconductor region 202. Furthermore, depending on the overall process and device requirements, a spacer structure 222 may be formed on sidewalls of the gate electrode structure 221. It should be appreciated that the transistors 220B, 220C may have any other appropriate configuration in which certain components of the transistors 220B, 220C may be positioned in close proximity to each other and requiring a plurality of contact elements to be formed so as to extend to specified contact regions, such as a region 202C connected to the semiconductor region 202. Consequently, the contact region 202C may comprise a metal-containing material, such as a metal silicide and the like, which, for convenience, is not shown in FIG. 2a. For example, the contact region 202C may be in contact with drain and/or source regions 225 of the transistors 220B, 220C. It should be appreciated that "closely spaced" transistor elements are to be understood as adjacent transistors, such as the transistors 220B, 220C, in which the spacing between the electrode materials 221B is approximately 200 nm and less, such as 100 nm and less in sophisticated applications.

Furthermore, the semiconductor device 200 may comprise an interlayer dielectric material 250 formed between and above the transistors 220B, 220C, wherein the material 250 may comprise a stress-inducing material 230, for instance provided in the form of silicon nitride, nitrogen-containing silicon carbide and the like, so as to induce a desired type of strain 230S in the channel regions 224. Furthermore, the interlayer dielectric material 250 may comprise a further dielectric material 250A, such as silicon dioxide and the like, depending on the overall process and device requirements. Furthermore, the interlayer dielectric material 250 may comprise a void 232 which may be formed in one or both of the materials 230, 250A, depending on the preceding manufacturing strategy.

The semiconductor device 200 may be formed on the basis of any appropriate manufacturing strategy, which may comprise similar process techniques as previously described with reference to the semiconductor device 100 when referring to dual stress liner approaches. It should be appreciated, however, that any other manufacturing sequence may be used, such as the provision of a single stress-inducing material, which may or may not be relaxed above certain device portions, depending on the overall requirements. Although the gate electrode structures 221 may create a sophisticated topography prior to depositing the interlayer dielectric material 250, enhanced flexibility in selecting appropriate deposition parameters and materials may be achieved since the void 232 may not be considered as a deposition-related irregularity but may intentionally be created, thereby providing the possibility of using an increased thickness for the layer 230, which may result in an enhanced strain transfer efficiency. Thus, any appropriate patterning strategy may be used, for instance by providing respective etch stop and etch indicator materials, as previously described, which may thus result in the formation of the void 232, wherein the size of the void 232 and the position in lateral and vertical direction may be determined by the specifically selected process parameters. In this respect, it should be noted that any positional information is to be understood as a relative position statement with respect to the substrate 201 or the semiconductor region 202, which may represent a corresponding reference. Thus, a lateral direction may be a direction that is substantially parallel to an interface 201S, while a vertical direction may indicate a direction substantially perpendicular to the interface 201S.

Figure 2B:
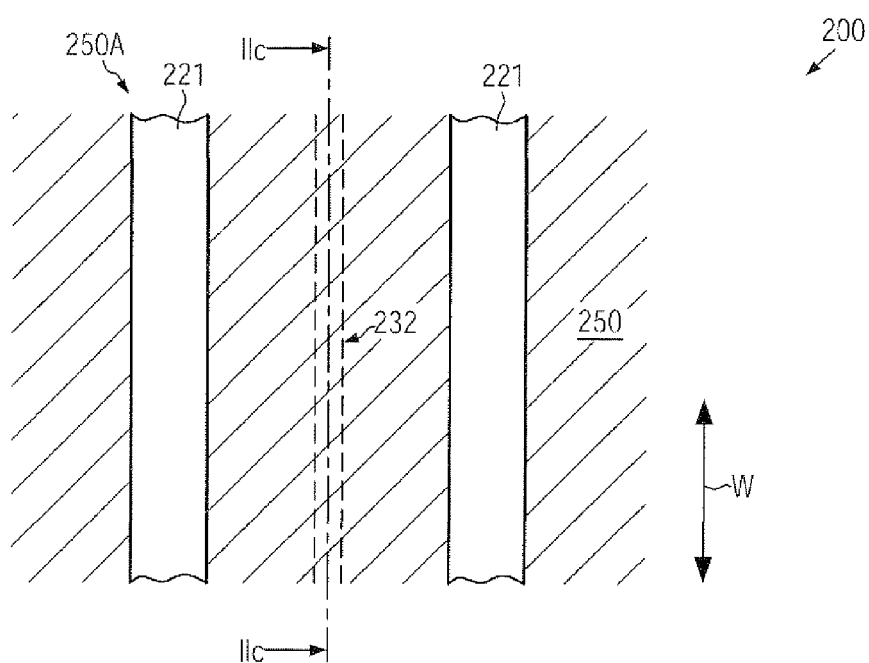

FIG. 2b schematically illustrates the semiconductor device 200 in a top view wherein the void is illustrated to be positioned between the gate electrode structures 221 and extending along a width direction, indicated as W.

Figure 2C:
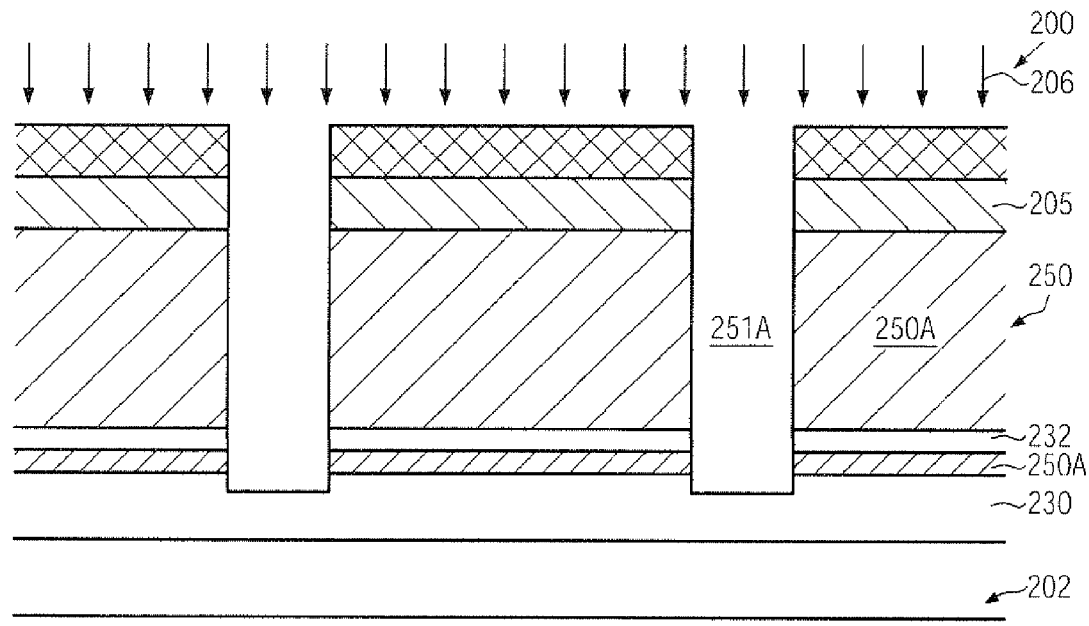
FIGS. 2c-2f schematically illustrate cross-sectional views along a transistor width direction wherein various manufacturing stages are illustrated for reducing metal migration along a void by providing a metal confinement liner according to illustrative embodiments.

FIG. 2c schematically illustrates a cross-sectional view of the semiconductor device 200 along the section IIc of FIG. 2b in a further advanced manufacturing stage. As illustrated, an etch mask 205, such as a hard mask material and the like, may be formed above the dielectric material 250A and may define the lateral size and position of contact openings to be formed in the interlayer dielectric material 250. In the manufacturing stage shown, a first portion 251A of these contact openings is formed in the material 250 so as to extend at least to the void 232. It should be appreciated that the vertical position of the void 232 may depend on the preceding manufacturing sequence, as previously discussed with reference to the device 100, so that the voids 232 may be formed substantially entirely within the material 250A or may be formed so as to extend into the material of the layer 230. Thus, in some illustrative embodiments, a depth of the void 232 may be determined in advance and process parameters of an etch process 206 may be appropriately selected so as to obtain, in combination with a corresponding etch time, a depth of the portion 251A that extends at least to the void 232 irrespective of its vertical position. For this purpose, respective measurement data may be obtained after the process sequence for forming the interlayer dielectric material 250. The etch process 206 may be performed on the basis of well-established etch recipes, for instance on the basis of chlorine or fluorine-based etch chemistries using a plasma assisted etch atmosphere.

Figure 2D:
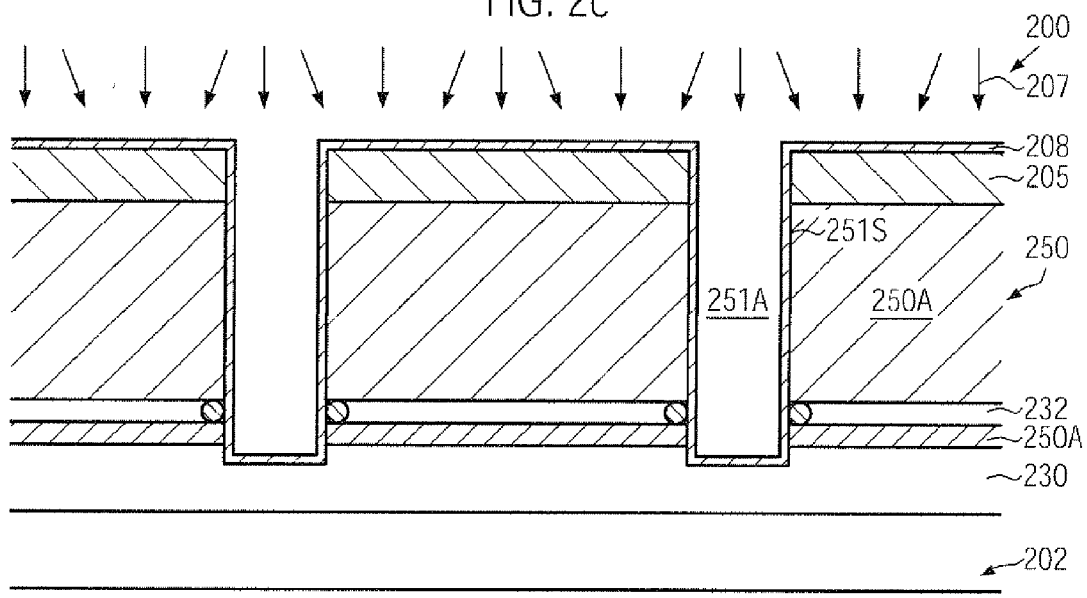

FIG. 2d schematically illustrates the semiconductor device 200 according to one illustrative embodiment in which the device 200 is exposed to a deposition ambient 207 in order to form a liner material 208 on exposed inner sidewalls 251S of the portions 251A. For example, the deposition ambient 207 may be established on the basis of well-established thermally activated CVD recipes, for instance at elevated process pressures in the range of 100 to several hundred Torr, which may typically be referred to as sub-atmospheric CVD. In this case, using TEOS as a precursor material, a superior deposition behavior may be obtained in which a deposition of material of the layer 208 may also be achieved at the void 232, thereby substantially completely closing or sealing the void 232 by material of the layer 208. For example, a silicon dioxide layer with an average thickness within the openings 251A of approximately 5-10 nm may be formed during the deposition process 207, thereby also reliably "disconnecting" the void 232 from the openings 251A. In other illustrative embodiments, the layer 208 may be comprised of any other appropriate dielectric material as long as integrity of the layer 208, at least at the void 232, may not be unduly compromised during the further processing. For example, the layer 208 may be provided in the form of a silicon nitride material if the layer 230 may be etched on the basis of a highly anisotropic etch recipe so as to maintain the sealing of the void 232 during a corresponding further etch step. In other illustrative embodiments, any other appropriate material, such as polysilicon, possibly in a highly doped state, may be formed on the basis of low pressure CVD and the like, thereby enhancing overall conductivity of the finally obtained contact element. In still other illustrative embodiments, a metal-containing material may be used as long as a metal-confining effect may be provided in view of a contact metal to be filled into the openings 251A in a later manufacturing stage and as long as a material of the layer 208 itself may be stable and may not exhibit a pronounced diffusion or migration behavior during the further processing and the operation of the semiconductor device 200.

Figure 2E:
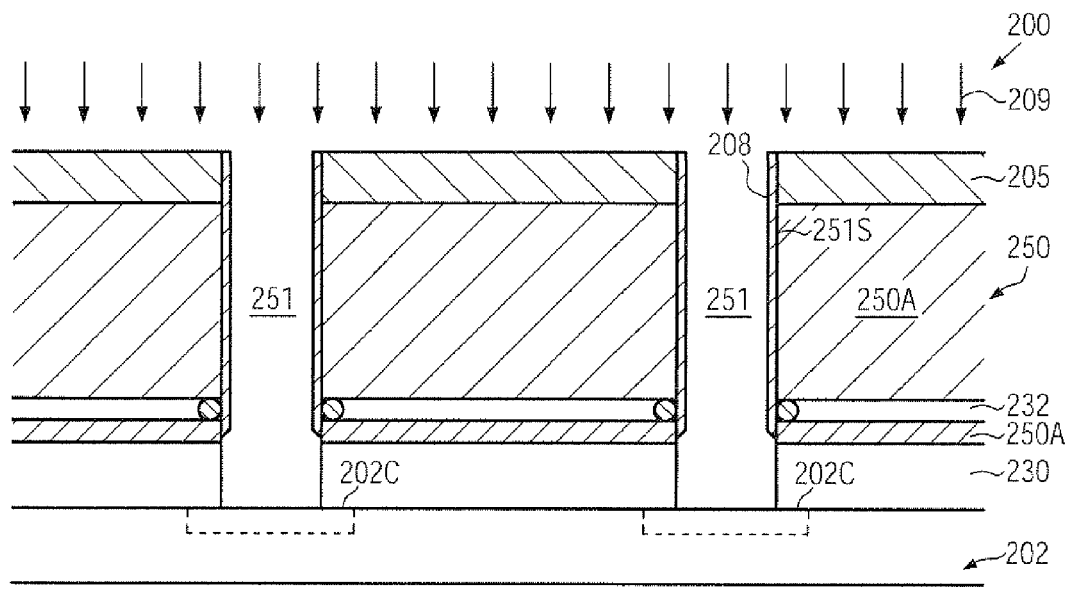

FIG. 2e schematically illustrates the semiconductor device 200 in a further advanced manufacturing stage in which the device 200 may be exposed to a further etch ambient 209 in order to form contact openings 251 that connect to the contact regions 202C. It should be appreciated that, typically, the contact regions 202C of FIG. 2e may be electrically isolated from each other, thereby also requiring a corresponding electric isolation of the contact elements to be formed in the openings 251. For instance, a corresponding contact regime requiring a plurality of closely spaced contact elements that are electrically isolated from each other may be encountered in RAM (random access memory) areas of sophisticated semiconductor devices, such as CPUs and the like.

As illustrated, the etch process 209 may comprise one highly anisotropic etch step so as to remove the liner material from the bottom of the portion 251A (FIG. 2c), wherein the anisotropic nature may be maintained if the material of the liner 208 may have a similar etch behavior compared to the material 250A and/or the material 230. Consequently, during the etch process 209, the sealing of the void 232 may be maintained since at least a portion of the liner 208 may not be removed during the process 209. Furthermore, the process 209 may comprise an appropriate etch strategy for etching through the layer 230, which may be used as an etch stop material for etching through the material 250A, if desired. As explained above, if the material 208 may have a similar etch behavior relative to the material 230, a highly anisotropic etch step may be used for etching to the contact region 202C, while, in other cases, any other well-established etch techniques may be used in which the layer 230 may be etched selectively with respect to the material 250A and the layer 208. For example, a plurality of highly selective etch recipes for etching silicon nitride material selectively to silicon dioxide material are known and may be used for this case.

Figure 2F:
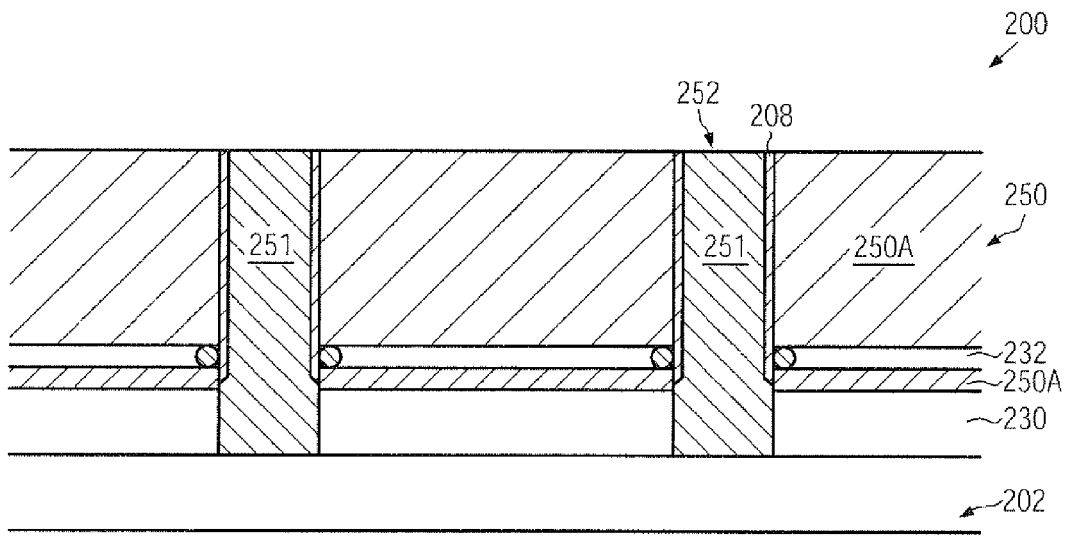

FIG. 2*f* schematically illustrates the semiconductor device 200 in a further advanced manufacturing stage. As illustrated, contact elements 252 may be provided on the basis of the contact openings 251 and may comprise any appropriate contact metal, such as tungsten, aluminum, copper, any alloys thereof and the like, possibly in combination with an appropriate conductive barrier material (not shown), as required by the overall process strategy. Thus, the metal of the contact elements 252 may be confined within the openings 251 by the material 208 which may reliably seal and thus electrically disconnect the contact elements 252 from the void 232.

The semiconductor device 200 as illustrated in FIG. 2*f* may be formed on the basis of any well-established process technique. For example, one or more appropriate materials may be deposited so as to fill the openings 251 in a state, as shown in FIG. 2*e*, which may include sputter deposition and the like for providing a barrier material, if required, followed by any other appropriate deposition process, such as CVD and the like, depending on the material to be deposited and the manufacturing strategy. Thereafter, any excess material may be removed, for instance on the basis of chemical mechanical polishing (CMP) wherein the mask layer 205 (FIG. 2*e*) may also be removed.

Figure 2G:
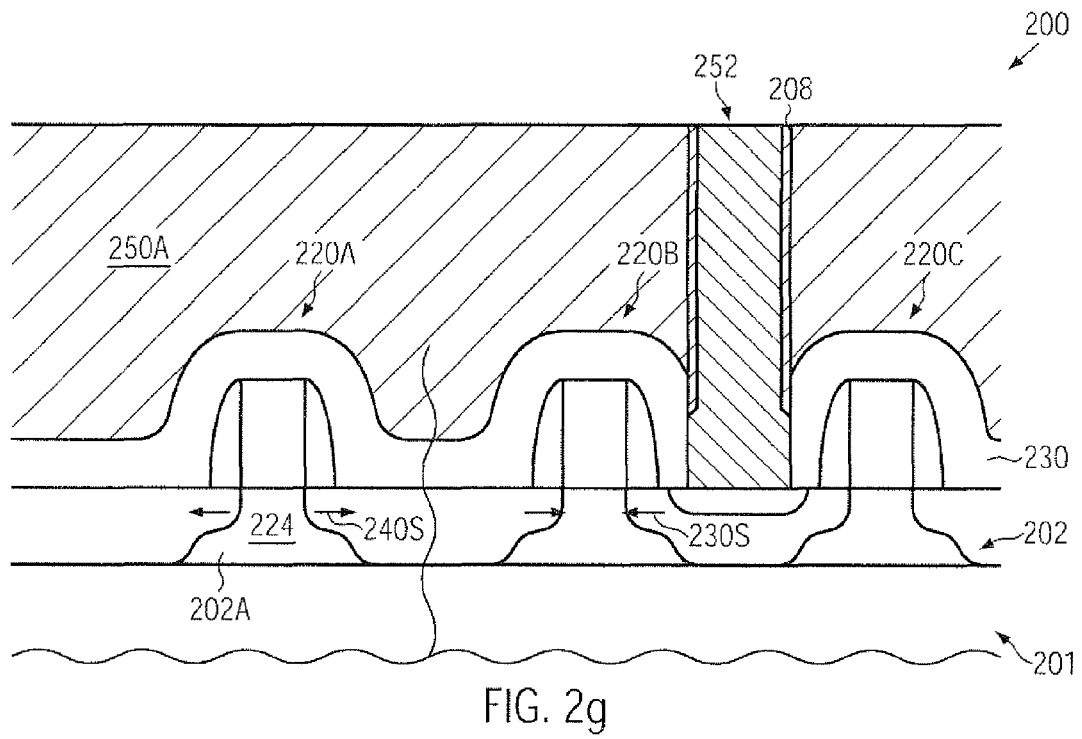
FIG. 2g schematically illustrates a cross-sectional view of the device along the transistor length direction in a further advanced manufacturing stage according to illustrative embodiments.

FIG. 2*g* schematically illustrates a cross-sectional view of the semiconductor device 200 according to further illustrative embodiments in which the contact element 252 comprising the liner 208 may be formed between the transistors 220B, 220C. Moreover, a further transistor element 220A may be formed in and above a second semiconductor region 202A, which may be provided in the same basic semiconductor material 202, which however may be separated from the transistors 220B, 220C by an isolation structure (not shown), if required. The transistor 220A may basically have a similar configuration as the transistors 220B, 220C, while, in one illustrative embodiment, however the transistor 220A may represent a transistor of a different conductivity type, thereby also requiring a different type of strain 240S in the channel region 224. For this purpose, a stressed dielectric layer 240 may be selectively formed above the transistor 220A in order to create the desired strain component 240S. For this purpose, a corresponding dual stress liner approach may be applied, as previously discussed with reference to the device 100. Consequently, the stressed dielectric materials 230 and 240 may be deposited and patterned on the basis of less restrictive process parameters, since the creation of a void may be accepted, which may, in some illustrative embodiments, intentionally be initiated so as to provide a reduced parasitic capacitance, as previously explained. Thus, after forming the stressed dielectric materials 230, 240 in accordance with any desired manufacturing strategy and after the deposition of the material 250A, the contact element 252 may be formed on the basis of the liner 208, as previously explained, thereby significantly reducing the probability of creating contact failures. Hence, the strain-inducing mechanism provided by the differently stressed dielectric layers 230, 240 may be applied to semiconductor devices of critical dimensions including a gate length of 50 nm and less, without unduly increasing overall yield losses.

Figure 2H:
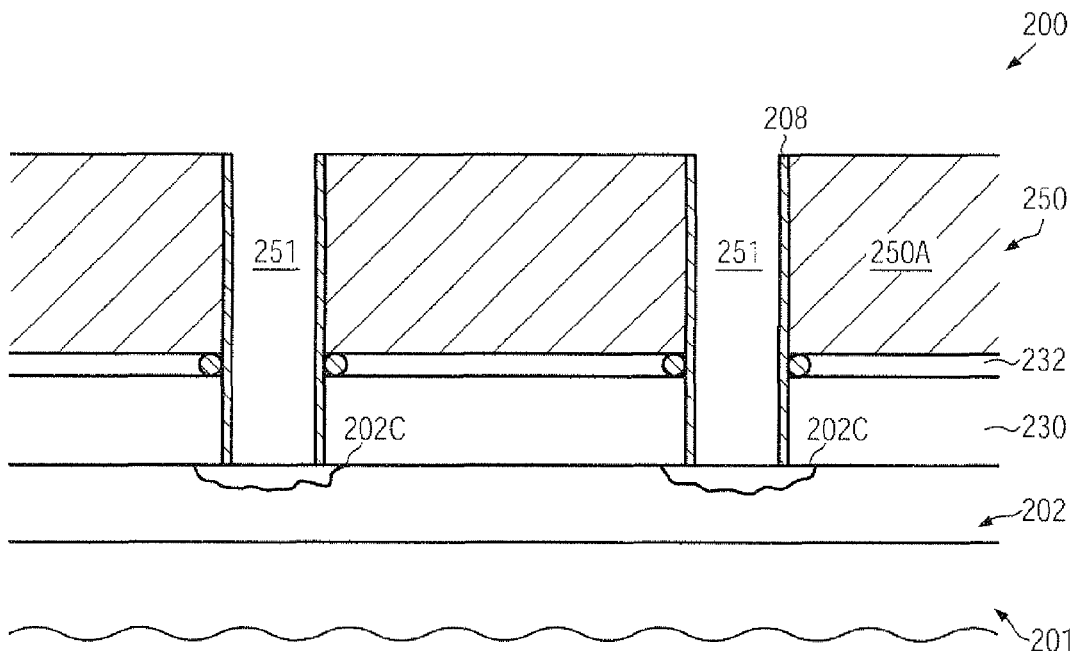
FIG. 2h schematically illustrates a cross-sectional view along the transistor width direction in a manufacturing stage in which a metal confinement liner material may be formed so as to extend along substantially the entire depth of the contact openings according to still further illustrative embodiments.

FIG. 2*h* schematically illustrates the semiconductor device 200 according to a further illustrative embodiment. As illustrated, the contact openings 251 may be formed so as to extend to the contact regions 202C, which may be accomplished on the basis of any appropriate etch strategy, for instance based on conventional etch recipes. Thereafter, a liner material 208 may be deposited as previously described, and subsequently a further etch step may be performed so as to remove the material of the layer 208 from the bottom of the opening 251, thereby exposing the contact areas 202C. It should be appreciated that this final etch step may be performed as an anisotropic step thereby not unduly affecting integrity of the liner 208 at the sidewalls of the opening 251, thereby maintaining the sealed state of the void 232. Thereafter, the further processing may be continued by filling the openings 251, as described above.

It should be appreciated that, in many of the above-described embodiments, it is referred to a stressed dielectric material provided as a portion of the interlayer dielectric material, since in many sophisticated devices the resulting strain-inducing mechanism may be used for enhancing performance. The embodiments described above may also be used for interlayer dielectric materials formed on the basis of materials that may not have any pronounced internal stress levels. That is, in other embodiments, the "void confinement" described above may be applied in the context of any type of interlayer dielectric material irrespective of the internal stress level.

As a result, the present disclosure provides semiconductor devices and techniques for forming the same in which a disadvantageous effect of voids formed between closely spaced gate electrode structures may be "compensated for" by appropriately sealing the voids within respective contact openings prior to filling in the contact metal. In this manner, enhanced flexibility in designing the overall sequence for forming the interlayer dielectric material and patterning the same may be accomplished, while at the same time superior device performance may be achieved since the void may result in reduced parasitic capacitance between the closely spaced gate electrode structures. Furthermore, in embodiments in which additional strain components are required, an increased amount of stress-inducing material may be incorporated into the interlayer dielectric material, thereby providing the possibility of extending well-established strain-inducing mechanisms to future device generations including transistor elements with a gate length of 50 nm and less.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming an interlayer dielectric material above a plurality of closely spaced transistors formed in and above a semiconductor region of a semiconductor device so as to create a void between at least two adjacent ones of said closely spaced transistors;
   forming a contact opening in said interlayer dielectric material, said contact opening extending to a contact region of said semiconductor region, said interlayer dielectric material comprising a stressed dielectric material for inducing a strain in said semiconductor region;
   forming a metal confinement liner material at least partially on inner sidewalls of said contact opening to disconnect said void from said contact opening; and filling said contact opening with a metal-containing material.

2. The method of claim 1, wherein forming said contact opening comprises forming a first portion of said contact opening to connect to said void, forming said metal confinement liner material on inner sidewalls of said first portion and forming a second portion of said contact opening so as to extend to said contact region.

3. The method of claim 1, wherein said contact opening is formed so as to extend to said contact region prior to forming said metal confinement liner material.

4. The method of claim 1, wherein said metal confinement liner material comprises silicon dioxide.

5. The method of claim 4, wherein said metal confinement liner material is formed by performing a sub-atmospheric chemical vapor deposition process.

6. The method of claim 1, wherein forming said interlayer dielectric material further comprises forming a second stressed dielectric material above a second semiconductor region so as to induce a second type of strain in said second semiconductor region that differs from said strain.

7. The method of claim 1, wherein a gate length of said closely spaced transistors is approximately 50 nm or less.

8. The method of claim 1, wherein
said void extends along a transistor width direction between two adjacent ones of said plurality of transistors and said metal confinement liner material suppresses metal migration from said contact opening into said void.

9. The method of claim 1, wherein forming said interlayer dielectric material comprises forming said stressed dielectric material above said plurality of closely spaced transistors and forming at least one further dielectric material above said stressed dielectric material.

10. The method of claim 1, wherein said metal confinement liner material comprises a dielectric material.

11. The method of claim 10, wherein said metal confinement liner material is formed by a thermally activated chemical vapor deposition process.

* * * * *